(12) United States Patent
McKerreghan et al.

(10) Patent No.: US 7,554,180 B2
(45) Date of Patent: Jun. 30, 2009

(54) PACKAGE HAVING EXPOSED INTEGRATED CIRCUIT DEVICE

(75) Inventors: Michael H. McKerreghan, Farmers Branch, TX (US); Shafidul Islam, Plano, TX (US); Romarico S. San Antonio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 0 days.

(21) Appl. No.: 10/536,859

(22) PCT Filed: Dec. 2, 2003

(86) PCT No.: PCT/US03/38048

§ 371 (c)(1),
(2), (4) Date: Jun. 26, 2006

(87) PCT Pub. No.: WO2004/053931

PCT Pub. Date: Jun. 24, 2004

(65) Prior Publication Data

US 2007/0145547 A1 Jun. 28, 2007

Related U.S. Application Data

(60) Provisional application No. 60/431,833, filed on Dec. 9, 2002.

(51) Int. Cl.
*H01L 21/50* (2006.01)
(52) U.S. Cl. .............................. 257/676; 257/E29.345
(58) Field of Classification Search ............. 257/691, 257/778, 735, 777, 666–676, 678–690, E29.345
See application file for complete search history.

(56) References Cited

U.S. PATENT DOCUMENTS

| | | | |
|---|---|---|---|
| 5,302,849 A | 4/1994 | Cavasin | 257/666 |
| 6,100,594 A | 8/2000 | Fukui et al. | |
| 6,107,164 A | 8/2000 | Ohuchi | |
| 6,208,021 B1 | 3/2001 | Ohuchi et al. | |
| 6,280,662 B1 | 8/2001 | Beratan et al. | |
| 6,326,701 B1 | 12/2001 | Shinogi et al. | |
| 6,580,152 B2 | 6/2003 | Hasegawa | |

(Continued)

FOREIGN PATENT DOCUMENTS

JP 63143851 6/1988

(Continued)

*Primary Examiner*—Nathan W Ha
(74) *Attorney, Agent, or Firm*—Wiggin and Dana LLP

(57) ABSTRACT

A package (10) includes an integrated circuit device (12) having an electrically active surface (16) and an opposing backside surface (14). A dielectric molding resin (26) at least partially encapsulates the integrated circuit die and the plurality of electrically conductive leads (20) with the backside surface (14) and the plurality of electrical contacts (24) being exposed on opposing sides of the package (10). Features (30) are formed into electrically inactive portions of the integrated circuit die (12) to seal moisture paths and relieve packaging stress. The features (30) are formed by forming a trough (54) partially through the backside (56) of the wafer (40) in alignment with a saw street (48), the trough (54) having a first width; and forming a channel (62) extending from the trough (54) to the electrically active face (42) to thereby singulate the integrated circuit device member, the channel (62) having a second width that is less than the first width. (Drawing FIG.2)

6 Claims, 4 Drawing Sheets

U.S. PATENT DOCUMENTS

| | | | |
|---|---|---|---|
| 6,680,524 B2 * | 1/2004 | Minamio et al. | 257/678 |
| 6,700,206 B2 * | 3/2004 | Kinsman | 257/777 |
| 6,724,071 B2 * | 4/2004 | Combs | 257/666 |
| 6,759,745 B2 * | 7/2004 | Masumoto et al. | 257/730 |
| 6,858,919 B2 * | 2/2005 | Seo et al. | 257/666 |
| 7,192,798 B2 * | 3/2007 | Okada et al. | 438/51 |
| 7,242,076 B2 * | 7/2007 | Dolan | 257/666 |
| 7,381,588 B1 * | 6/2008 | Patel et al. | 438/109 |
| 2002/0167078 A1 | 11/2002 | Winderl et al. | 257/684 |

FOREIGN PATENT DOCUMENTS

| | | |
|---|---|---|
| JP | 02177447 | 7/1990 |
| JP | 08031773 | 2/1996 |
| JP | 2000091490 | 3/2000 |

\* cited by examiner

PACKAGE HAVING EXPOSED INTEGRATED CIRCUIT DEVICE

CROSS REFERENCE TO RELATED APPLICATION

This application claims the benefit of U.S. Provisional Patent Application No. 60/431,833 filed on 9 Dec. 2002, which is incorporated by reference herein in its entirety.

BACKGROUND OF THE INVENTION

1. Field of the Invention:

This invention relates to a package to encapsulate an integrated circuit device (die). More particularly, this invention relates to a package having an exposed integrated circuit device and a method for the manufacture of such a package.

2. Description of the Related Art:

Molded plastic electronic packages provide environmental protection to integrated circuit devices. Packages such as the PQFP (plastic quad flat pack) and the PLCC (plastic leaded chip carrier) protect an encapsulated device from contaminants such as moisture and from mechanical shock.

One disadvantage with molded plastic packages is poor thermal dissipation. During operation, the integrated circuit device generates heat that must be removed to maintain the operating integrity of the device. Some heat is dissipated through the bonding wires and the lead frame, the remainder is absorbed into the molding resin. The molding resin is a poor thermal conductor so the device temperature increases. To prevent the device from overheating, the power provided to the device must be limited.

One way to increase thermal dissipation is to mount the backside of the integrated circuit device on to a metallic heat spreader. As disclosed in U.S. Pat. No. 5,608,267, this heat spreader may be only partially encapsulated into the molding resin to provide enhanced thermal dissipation. However, having a heat spreader to molding resin interface provides a source of ingress for moisture. Moisture migrates along the interface and causes internal metallic components to corrode. Also, when heated, the moisture may expand destroying the integrity of the molded plastic package. One solution, as disclosed in U.S. Pat. No. 6,188,130, is to incorporate features into the heat spreader to increase the distance moisture must travel to reach encapsulated components. Both the U.S. Pat. No. 5,608,267 patent and the U.S. Pat. No. 6,188,130 patent are incorporated by reference in their entireties herein.

While an exposed backside heat spreader enhances thermal dissipation, the thickness of the molded plastic package must be sufficient to partially encapsulate the heat spreader. In addition, there is a move towards packages with enhanced sensing capabilities, such as optical, thermal or mechanical sensing. The presence of a large metallic heat spreader interferes with the sensing capabilities.

There remains a need for a molded plastic package having the combination of effective thermal dissipation and good sensing capabilities that is further thinner than the present electronic packages. There further remains a need for a method to easily assemble such molded plastic packages.

BRIEF SUMMARY OF THE INVENTION

In accordance with a first embodiment of the invention there is provided a package encapsulating an integrated circuit device. The integrated circuit device has an electrically active surface and an opposing backside surface. The electrically active surface has a plurality of electrically active circuit traces that terminate at metallized bumps. The package further includes a plurality of electrically conductive leads each having respective first surfaces and opposing second surfaces with a plurality of electrical contacts extending outward from the first surfaces. A solder electrically and mechanically bonds the metallized bumps to the second surfaces. A dielectric molding resin is formed into a package and at least partially encapsulates the integrated circuit die and the plurality of electrically conductive leads with the backside surface and the plurality of electrical contacts is exposed on opposing sides of said package.

In accordance with a second embodiment of the invention, there is provided a method to singualte an integrated circuit die member. This method includes the steps of: (a). providing a wafer containing a matrix of integrated circuit device members, each one of the integrated circuit device members having a respective electrically active face and an opposing backside, and a saw street circumscribing each one of the integrated circuit members; (b). forming a trough partially through the backside of the wafer in alignment with the saw street, the trough having a first width; and (c). forming a channel extending from the trough to the electrically active face to thereby singulate the integrated circuit device member, the channel having a second width that is less than the first width.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

Like reference numbers and designations in the various drawings indicated like elements.

DETAILED DESCRIPTION

Figure 1:
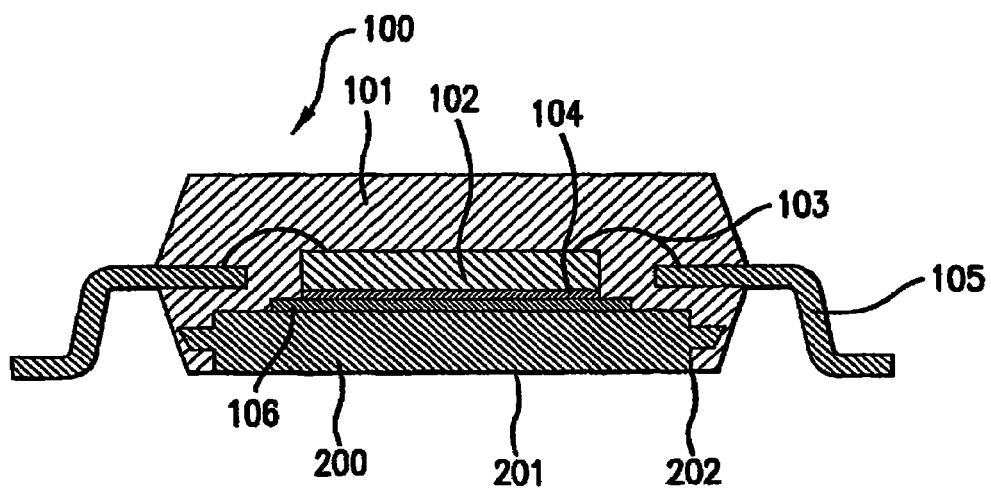
FIG. 1 illustrates in cross-sectional representation a molded plastic package with exposed heat spreader as known from the prior art.

FIG. 1 shows in cross-sectional representation a molded plastic package 100 with exposed heat spreader that is known generally from the prior art and more particularly from U.S. Pat. No. 6,188,130. The package 100 includes a semiconductor device 102, such as a silicon-based integrated circuit with a backside bonded 104 to a die paddle 106. To enhance thermal dissipation, the die paddle 106 is bonded, or in thermal contact, with a heat spreader 200. An electrically active face of the semiconductor device 102 is electrically interconnected by wire bonds 103 to external leads 105. When electrical signals pass through circuitry formed on the electrically active face of the semiconductor device, internal resistance is manifest as heat. Failure to remove this heat reduces the operating lifetime of the semiconductor device.

A polymeric molding resin 101, such as an epoxy, encapsulates the semiconductor device 102, die paddle 106, inner leads of lead frame 105 and a portion of the heat spreader 200. A surface 201 of the heat spreader is exposed to the external environment and intended to be bonded to an external heat sink or to a printed circuit board. The polymeric molding resin 101 is a generally poor thermal dissipater, so exposing a surface 201 of heat spreader 200 enhances the removal of heat from the integrated circuit device 102.

Figure 2:
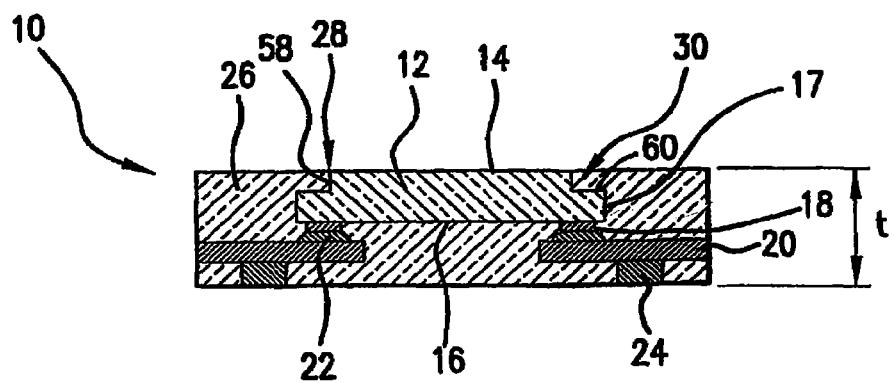
FIG. 2 illustrates in cross sectional representation a molded plastic package with exposed integrated circuit die backside in accordance with an embodiment of the invention.

FIG. 2 illustrates in cross-sectional representation, a molded plastic package 10 having an integrated circuit device 12 with exposed backside 14 in accordance with the present invention. By "backside" it is meant the major planar surface of the integrated circuit device 12 that does not contain electrically conductive circuit traces and is distinguished from the electrically active face 16 that does contain such circuit traces. Extending between these two major surfaces are sides 17. The circuit traces typically terminate at metallized bumps 18. Typically, the metallized bumps are solder coated (such as with an alloy of lead and tin), but may also be coated with a single metal, such as tin. In addition, rather than a coating, the metallized bump may terminate at a metal cap, such as formed from copper or a copper alloy. The metallized bumps are bonded and electrically interconnected to circuitry 20 by solder 22. Circuitry 20 is any form of electrically conductive circuit traces known in the art such as tape automated bonding (TAB) tape or a lead frame. Bonding between the metallized bumps 18 and circuitry 20 is by flip-chip bonding or other method. Electrical contacts, such as conductive pillars 24, extend from the circuitry 20 to provide electrical interconnection to external circuitry, such as a printed circuit board.

A dielectric molding resin 26, preferably a polymer such as epoxy, then encapsulates the assembly with the exception of the backside 14 and the conductive pillars 24. Optionally, as shown in FIG. 2, a portion of the circuitry 20 may also be exposed. The interface 28 between the backside 14 and molding resin 26 is a site of possible moisture ingress into the package 10. Step-feature 30 seals the moisture path along interface 28 enhancing package reliability. The step-feature includes at least two non-parallel elements such as sidewall 58 and base 60. Preferably, the two elements intersect at an angle of approximately 90°.

The package 10 has a number of other advantages over prior art packages as well. There is typically a coefficient of thermal expansion mis-match between the polymer molding resin 26 and the integrated circuit device 12. During operation, the package 10 may be exposed to temperature fluctuations, either externally induced, such as when the package is exposed to different temperatures or internally induced, due to resistance heating of the integrated circuit device during service. The step-feature 30 mechanically locks the integrated circuit device to the molding resin preventing slippage.

Further, unbalanced stressing is reduced to minimize flexing along the die-molding resin interface. The exposed backside is particularly suited for the sensing market where the integrated circuit device reacts to environmental changes, such as pressure or temperature differences.

In addition, by eliminating the need for a heat spreader, the thickness of the package is reduced. A package thickness less than three times the thickness of the integrated circuit device may be manufactured. This supports the industry move towards razor or paper-thin packages with a total package thickness, "t", on the order of 0.25 millimeter (0.01 inch). The package is particularly suited as a sensor to detect optical, thermal or mechanical external stimuli. Exemplary mechanical stimulus is touch.

Figure 3:
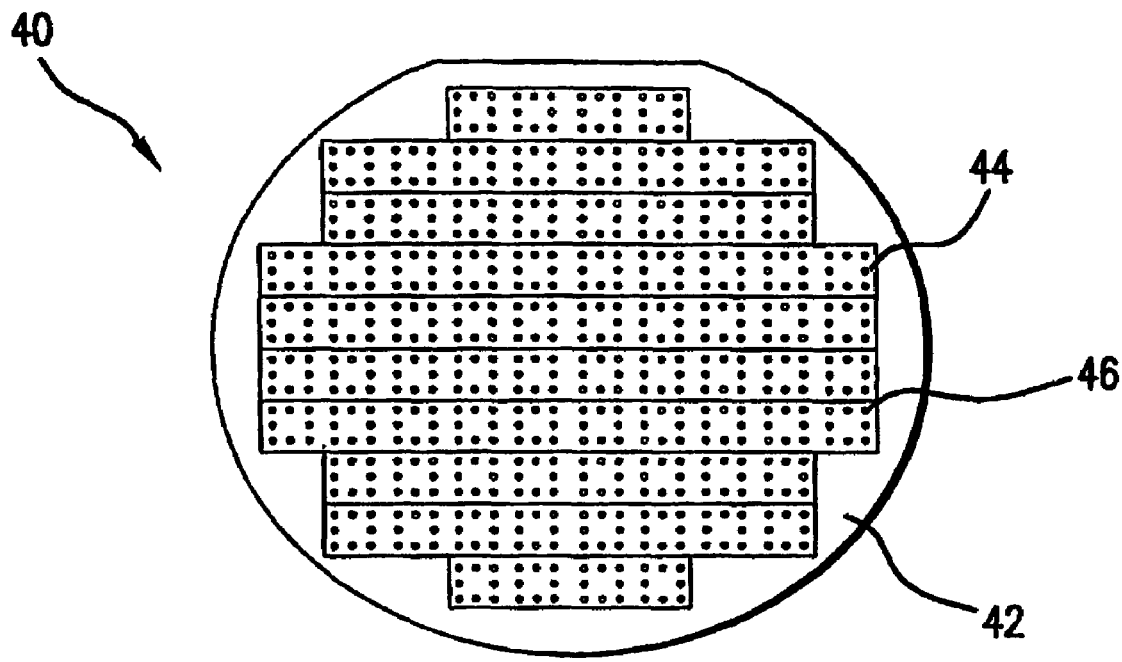
FIG. 3 illustrates in top planar view a wafer containing a plurality of integrated circuit devices prior to singulation.
Figure 4:
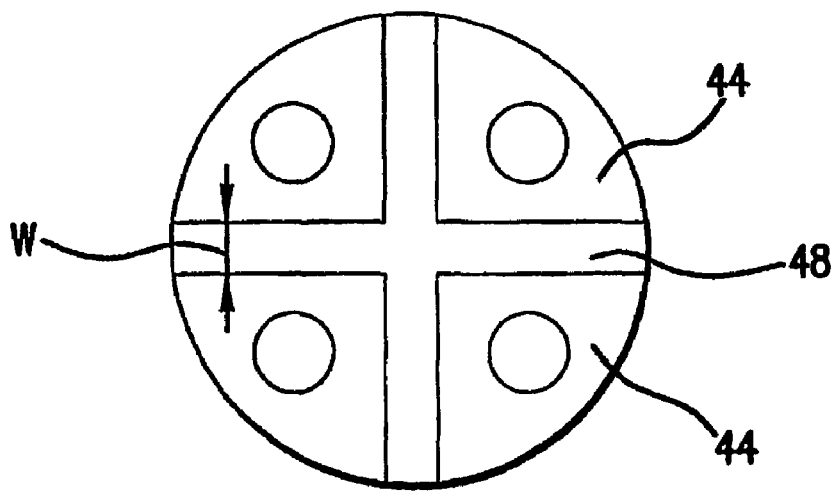
FIG. 4 is a magnified portion of a portion of the wafer of FIG. 3 illustrating saw streets.

Manufacture of package 10 is best understood with reference to FIGS. 3 through 6. Referring first to FIG. 3, a wafer 40 formed from silicon, or other semiconductor material such as gallium arsenide, has an initial thickness on the order of 26-30 mils (0.026-0.030 inch) and typically undergoes back grinding to reduce the thickness for better thermal characteristics. A front side 42 of the wafer 40 is formed into a plurality of semiconductor die 44 each having a pattern of electrically conductive circuit traces (not shown) terminating at solder coated bumps 46. As best illustrated in FIG. 4, the semiconductor die 44 are separated by electrically inactive portions 48, referred to as "saw streets" or "cutting streets." Typically, the electrically inactive portions have a width, "w", of about 4 mils (0.004 inch).

Figure 5A:
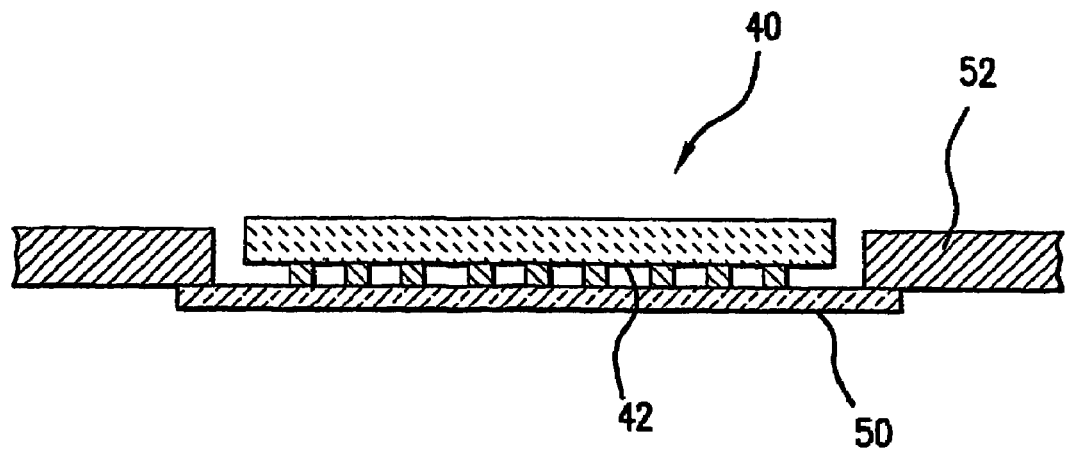
FIGS. 5A-5C illustrate a sequence of process steps to manufacture the molded plastic package of FIG. 2 in accordance with an embodiment of the invention.
Figure 5B:
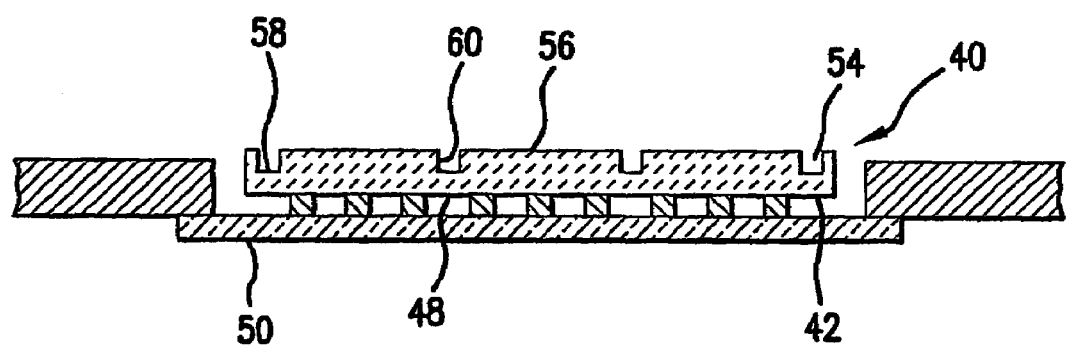
Figure 5C:
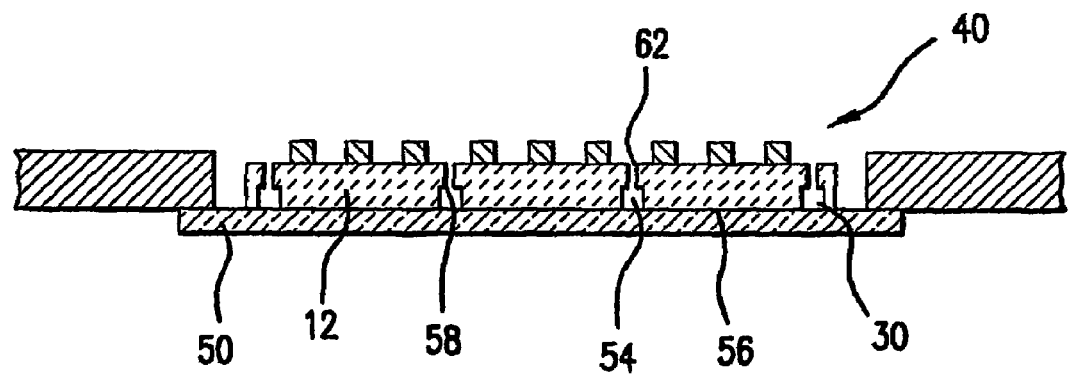

FIG. 5A through FIG. 5C illustrate a first method to manufacture an integrated circuit device useful for the semiconductor package of the invention. As shown in FIG. 5A, the wafer 40 is mounted with electrically active face 42 contacting an electrically nonconductive substrate 50. Preferably, the electrically active face is non-permanently bonded to the electrically non-conductive substrate, such as by a polymer adhesive. Most preferably, the nonconductive substrate 50 is an adhesive tape, such as blue tape (known as BlueTape SPV 224 and manufactured by Nitto Denko of Osaka, Japan). The electrically nonconductive substrate 50 is supported and aligned by an external frame 52.

With reference to FIG. 5B, a flat tipped saw or other cutting device capable of forming a "U-shaped" trough 54 cuts a portion, from 30% to 70% in depth, through the wafer from the backside 56. More preferably, the depth of trough 54 is from 40% to 60% of the wafer thickness, and most preferably, about 50% of the wafer thickness. The width of the trough is on the order of 3 mils to 6 mils (0.003 inch-0.006 inch) and is preferably about equal to the width of the saw street on the opposed electrically active face 42. The width of the saw blade may be less than the desired width of the trough, in which instance, several parallel passes with the saw blade may be utilized. The trough 54 is in alignment with and substantially underlies the saw street. Preferably, the base 58 and sidewalls 60 of the trough intersect at an angle of approximately 90°.

Following forming of U-shaped troughs 54, wafer 40 is removed from the electrically non-conductive substrates 50, flipped over and then remounted with the backside 56 bonded to electrically non-conductive substrate 50 as shown in FIG. 5C. Channels 62 are then formed along the saw streets to a depth effective to pierce the base 58 of U-shaped trough 54 singulating wafer 40 into individual integrated circuit devices 12. The channels 54 have a width less than the width of the U-shaped trough, such that step-feature 30 is formed in each integrated circuit device 12. The singualted integrated circuit devices are then removed from electrically non-conductive substrate 50 and processed for assembly into a package of the type illustrated in FIG. 2.

While the trough 54 is preferably U-shaped, the shape of the trough and the channel may be varied to achieve a range of features, such as cuts, pockets, grids, ribs and diagonal channels. The feature design is selected to introduce or retain structural strength of the wafer while relieving stress and improving the locking of the encapsulated semiconductor device. The end result is a semiconductor package with improved thermal performance and better sensing capability.

Figure 6A:
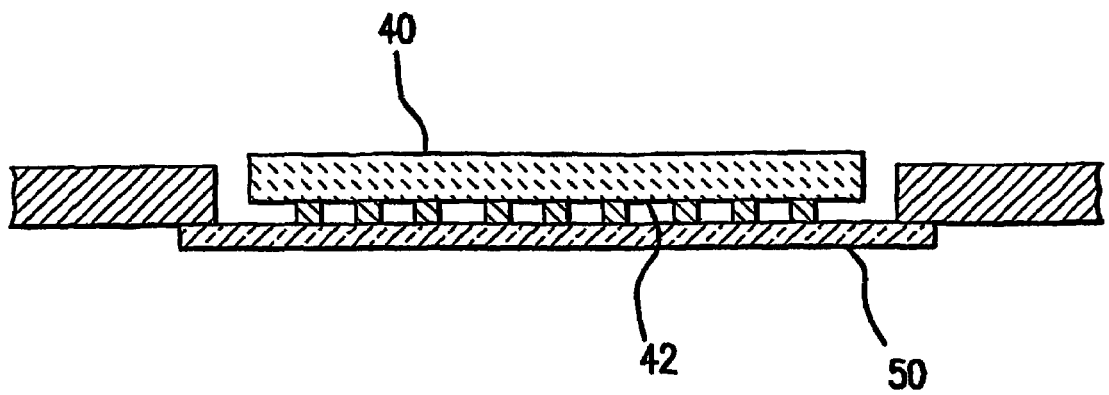
FIGS. 6A-6C illustrate a sequence of process steps to manufacture the molded plastic package of FIG. 2 in accordance with another embodiment of the invention.
Figure 6B:
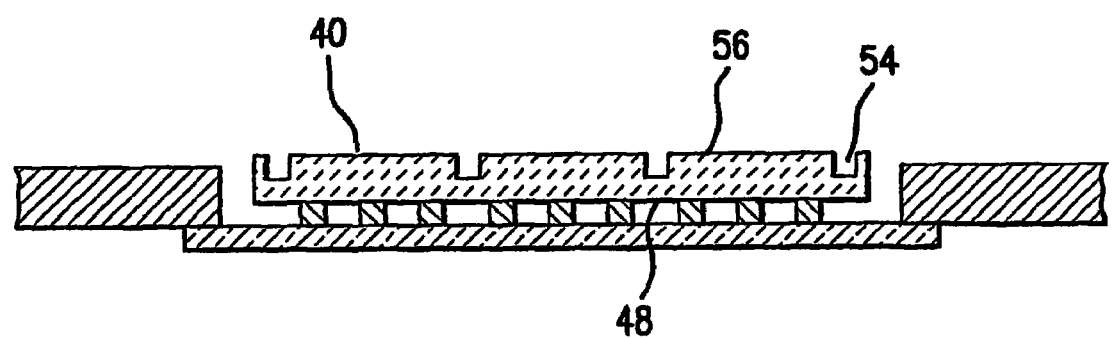
Figure 6C:
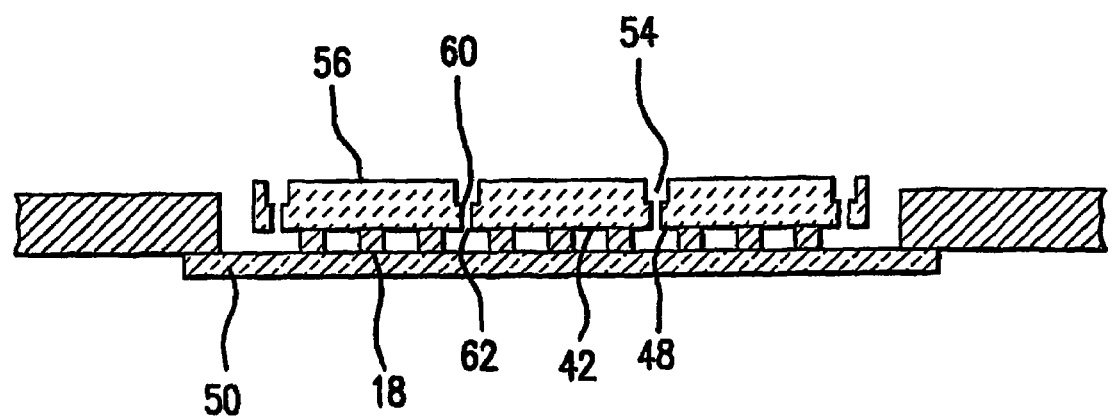

An alternative process, illustrated in FIGS. 6A through 6C eliminates the need to remove the wafer from the electrically non-conductive substrate and turn it over following formation of the U-shaped troughs. With reference to FIG. 6A, the wafer 40 is mounted to electrically non-conductive substrate 50 with electrically active face 42 contacting the electrically non-conductive substrates. As in the preceding embodiment, troughs 54 are cut part-way through the wafer 40 from the backside 56 as shown in FIG. 6B. As with the preceding embodiment, the troughs 54 substantially underlie the saw streets 48.

With reference to FIG. 6C, channels 62 are next formed extending from the base 60 of trough to pierce the electrically active face 42 at saw streets 48. To insure alignment between the channels 62 and saw streets 48, since the saw streets are not visible in this process embodiment, the wafer mounting process of FIG. 6A may incorporate a vision camera that would take several snapshots "on the fly," of the saw streets and wafer identification characters and pass these snapshots to an equipment alignment algorithm prior to forming the trough and step feature. This eliminates the need to remove the thin wafer after back-grind, remounting with electrically active surface facing up and the additional loading and handling associated with turning over the wafer prior to forming the channels. As a result, the wafer may be back-ground to a thickness of 25 microns or less.

Singulating the die in the format illustrated in FIG. 6C, with the solder coated bumps 18 contacting the non-conductive substrate 50 and backside 56 exposed eliminates the need to flip the semiconductor devices prior to flip chip bonding between circuitry and the solder coated bumps. The result is that conventional die attach "pick and place" devices can be used for flip-chip bonding. This eliminates the need for next generation flip-chip equipment technologies and capital outlay.

One or more embodiments of the present invention have been described. Nevertheless, it will be understood that various modifications may be made without departing from the spirit and scope of the invention. Accordingly, other embodiments are within the scope of the following claims.

What is claimed is:

1. An integrated circuit device package, comprising:
   an integrated circuit device having an electrically active surface and an opposing backside surface and sides extending therebetween, said electrically active surface having a plurality of electrically active circuit traces formed thereon and metallized bumps extending from selected sites on said circuit traces, and said sides including at least one feature that is effective to limit the ingress of moisture along an interface between said integrated circuit device and a dielectric molding resin, mechanically lock said integrated circuit device to said dielectric molding resin and cause said backside surface area to be less than said electrically active surface area;
   a plurality of electrically conductive leads each having respective first surfaces and opposing second surfaces;
   a plurality of electrical contacts extending outward from said respective first surfaces; and
   a solder electrically and mechanically bonding said metallized bumps to said second surfaces;
   wherein
   said dielectric molding resin is formed into a package at least partially encapsulating said integrated circuit device and said plurality of electrically conductive leads,
   said backside surface and said plurality of electrical contacts are exposed on opposing sides of said package,
   said interface has an end portion between said integrated circuit device at the exposed backside surface and the dielectric molding resin adjacent thereto, and an interior portion substantially parallel to the backside surface, and
   said electrically active surface includes a central region and a peripheral region, said metallized bumps disposed in the peripheral region and said dielectric molding resin covering the central region.

2. The package of claim 1 wherein said at least one feature includes two elements that intersect at an angle of approximately 90°.

3. The package of claim 1 wherein a thickness of said package is less than three times a thickness of said integrated circuit device.

4. The package of claim 3 wherein said thickness of said package is approximately 0.01 inch.

5. The package of claim 1 wherein said integrated circuit device is a sensor responsive to external stimulus.

6. The package of claim 5 wherein said external stimulus is a touch.

* * * * *